(12) United States Patent
Kim et al.

(10) Patent No.: US 10,725,495 B2
(45) Date of Patent: Jul. 28, 2020

(54) POWER GATING SYSTEM

(71) Applicant: Sk hynix Inc., Icheon-si Gyeonggi-do (KR)

(72) Inventors: Woongrae Kim, Icheon-si (KR); Seung Hun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/507,516

(22) Filed: Jul. 10, 2019

(65) Prior Publication Data

US 2020/0150710 A1    May 14, 2020

(30) Foreign Application Priority Data

Nov. 14, 2018  (KR) ........................ 10-2018-0139619

(51) Int. Cl.
*G06F 1/04* (2006.01)
*G06F 1/3203* (2019.01)
*G11C 5/14* (2006.01)
*H03K 3/012* (2006.01)

(52) U.S. Cl.
CPC .............. *G06F 1/04* (2013.01); *G06F 1/3203* (2013.01); *G11C 5/14* (2013.01); *H03K 3/012* (2013.01)

(58) Field of Classification Search
None
See application file for complete search history.

(56) References Cited

U.S. PATENT DOCUMENTS

| 7,016,246 | B2 * | 3/2006 | Watanabe | ............ | G11C 7/1072 |
| | | | | | 365/187 |
| 8,451,039 | B2 | 5/2013 | Myers et al. | | |
| 8,884,690 | B2 * | 11/2014 | Pan | ....................... | G11C 7/1078 |
| | | | | | 327/52 |
| 9,985,610 | B2 | 5/2018 | Kim et al. | | |
| 2011/0307233 | A1 * | 12/2011 | Tseng | .................... | G06F 30/331 |
| | | | | | 703/14 |
| 2016/0350259 | A1 * | 12/2016 | Jeon | .................... | G06F 13/4291 |
| 2017/0062035 | A1 * | 3/2017 | Antonyan | .............. | G11C 5/145 |

* cited by examiner

*Primary Examiner* — Lincoln D Donovan
*Assistant Examiner* — Khareem E Almo
(74) *Attorney, Agent, or Firm* — William Park & Associates Ltd.

(57) ABSTRACT

A power gating system includes a logic circuit region including at least one logic gate configured to receive a first gating clock signal. The power gating system also includes a power gating control circuit configured to generate the first gating clock signal which is controlled to start transition after stabilization of an internal power voltage according to a chip select signal, a command/address signal, and an external clock signal.

12 Claims, 5 Drawing Sheets

POWER GATING SYSTEM

CROSS-REFERENCES TO RELATED APPLICATION

The present application claims priority under 35 U.S.C. § 119(a) to Korean application number 10-2018-0139619, filed on Nov. 14, 2018, in the Korean Intellectual Property Office, which is incorporated herein by reference in its entirety.

BACKGROUND

1. Technical Field

Various embodiments may generally relate to a semiconductor circuit, and more particularly, to a power gating system.

2. Related Art

Currently, the form factor for electronic devices, such as portable electronic devices, continues to shrink as the number of function blocks built into the electronic devices continues to increase.

In particular, portable electronic devices operate with the limited power of a battery. Therefore, power consumed unnecessarily by the function blocks of portable electronic devices in a power-down mode is undesirable.

To reduce power consumption in a power-down mode, a power gating technology for preventing power from being supplied to the function blocks in a power-down mode has been applied to portable electronic devices.

For example, zigzag power gating technology has been applied to the function blocks of electronic devices.

The zigzag power gating technology is a method for shutting off power supplied in a power-down mode to remaining logic gates other than partial gates which require the constant power source among a plurality of logic gates included in the function blocks of electronic devices.

Figure 1:
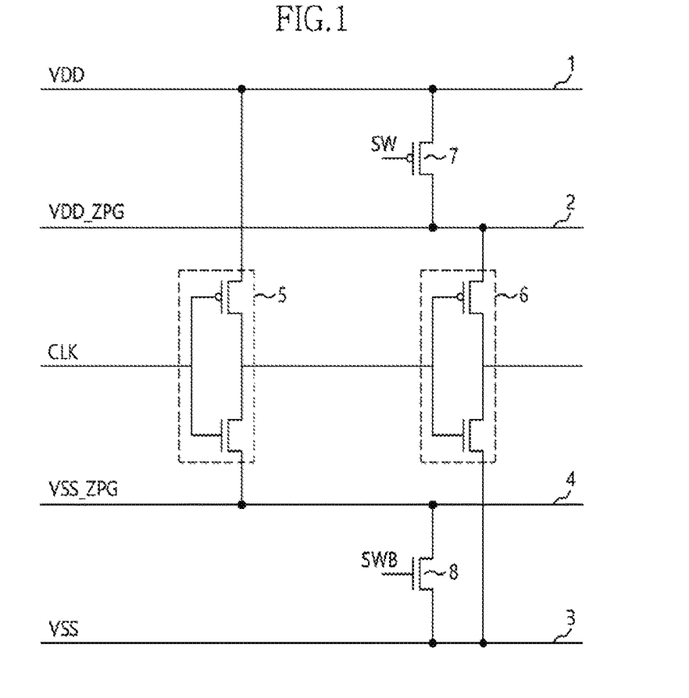
FIG. 1 is a schematic diagram illustrating a power gating operation error, according to an conventional power gating circuit.

A conventional zigzag power gating circuit is illustrated in FIG. 1 to include first to fourth power lines 1, 2, 3, and 4, logic gates 5 and 6, and power gating switches 7 and 8.

The power gating circuit receives a first power voltage VDD through the first power line 1, receives a second power voltage VDD_ZPG through the second power line 2, receives a first ground voltage VSS through the third power line 3, and receives a second ground voltage VSS_ZPG through the fourth power line 4.

The zigzag power gating circuit may be designed based on the condition that an external clock signal, for example, a clock signal CLK, is maintained to a low level in a power-down mode.

In the power-down mode, power gating signals SW and SWB may have a high level and a low level, respectively, and thus the second power line 2 and the fourth power line 4 may be floating.

When the clock signal CLK is not toggled but rather maintained at the low level, the logic gate 5 is coupled to the first power line 1 and the logic gate 6 is coupled to the third power line 3, thus, a floating current is not generated.

When the power gating signals SW and SWB have the low level and the high level, respectively, according to the power-down mode exit. And the second power voltage VDD_ZPG and then the second ground voltage VSS_ZPG are stabilized to target levels after a predetermined time from the power-down mode exit, the floating current may not be generated even when the clock signal CLK is toggled.

However, an power gating error may occur when the power gating signals SW and SWB are the low level and the high level and the clock signal CLK is transitioned to the high level before a predetermined time for stabilizing the second power voltage VDD_ZPG and the second ground voltage VSS_ZPG to target levels elapsed.

For example, as the power gating signals SW and SWB are transitioned to the low level and the high level, respectively, from the high level and the low level, the logic gate 5 is coupled to the fourth power line 4 and the logic gate 6 is coupled to the second power line 2. However, because the second power voltage VDD_ZPG and the second ground voltage VSS_ZPG might not reach the target levels, the power line 2 and 3 may be in a floating state. Accordingly, the floating current may be generated and thus an abnormal operation of the logic gates 5 and 6 may be caused.

SUMMARY

In an embodiment of the present disclosure, a power gating system may include a logic circuit region including at least one logic gate configured to receive a first gating clock signal. The power gating system may also include a power gating control circuit configured to generate the first gating clock signal which is controlled to start transition after stabilization of an internal power voltage according to a chip select signal, a command/address signal, and an external clock signal.

In another embodiment of the present disclosure, a power gating system may include a logic circuit region including at least one logic gate configured to receive a first gating clock signal. The power gating system may also include a power gating control circuit configured to generate the first gating clock signal which is controlled to start transition after stabilization of an internal power voltage according to a chip select signal, a command/address signal, and an external clock signal and configured to control an activation period of the first gating clock signal to match a read operation and a write operation.

BRIEF DESCRIPTION OF THE DRAWINGS

The aspects, features, and advantages of the subject matter of the present disclosure are more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configuration and shape which do not depart from the spirit and scope of the present teachings as set forth in the appended claims.

The present teachings are described herein with reference to cross-section and/or plan illustrations of idealized embodiments. However, presented embodiments of the present teachings should not be construed as being limiting. Although a limited number of possible embodiments for the present teachings are shown and described, it will be appreciated by those of ordinary skill in the art that changes may be made to these embodiments without departing from the principles and spirit of the present teachings.

Embodiments are provided to a power gating system capable of preventing a power gating error in power-down mode exit. Embodiments are also provided to a power gating system capable of reducing power consumption by blocking clock supply in a non-actual operation section of a semiconductor circuit.

Figure 2:
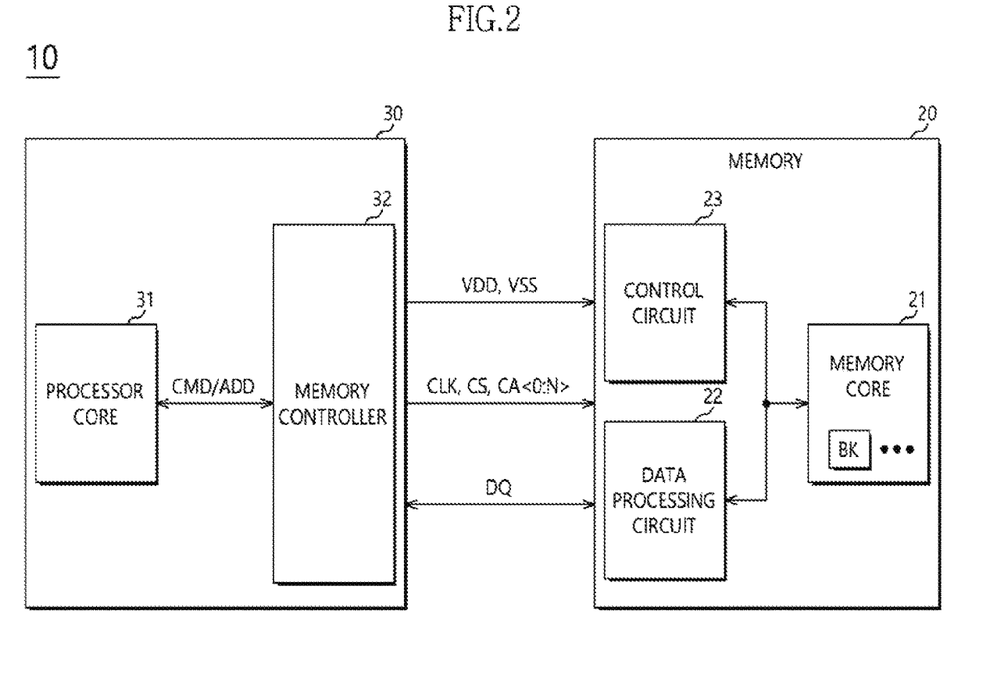
FIG. 2 is a block diagram illustrating a configuration of an electronic system, according to an embodiment of the present disclosure.

FIG. 2 is a block diagram illustrating a configuration of an electronic system 10, according to an embodiment.

Referring to FIG. 2, the electronic system 10 may include a memory 20 and a processor 30.

The electronic system 10 may be configured as a system on chip (SoC).

The processor 30 may be configured as a central processing unit (CPU) or a graphic processing unit (GPU).

The processor 30 may include a processor core 31 and a memory controller 32.

The processor core 31 may provide various commands CMD and an address ADD for controlling the memory 20 with the memory controller 32.

The memory controller 32 may control the memory 20 by providing a first power voltage VDD, a first ground voltage VSS, a chip select signal CS, and a command/address signal CA<0:N> to the memory 20 according to the command CMD and the address ADD provided from the processor core 31.

The memory controller 32 may transmit and receive data DQ to and from the memory 20.

The memory 20 may include a memory core 21, a data processing circuit 22, and a control circuit 23.

The memory core 21 may include a plurality of unit memory regions (for example, memory banks BK) and circuit elements for data input/output (I/O) of the memory banks BK.

The data processing circuit 22 may perform a data I/O-related operation between the memory core 21 and the memory controller 32.

The control circuit 23 may control a data read/write operation of the memory 20, a power gating-related operation, and the like according to the chip select signal CS and the command/address signal CA<0:N> provided by the memory controller 32 of the processor 30.

Figure 3:
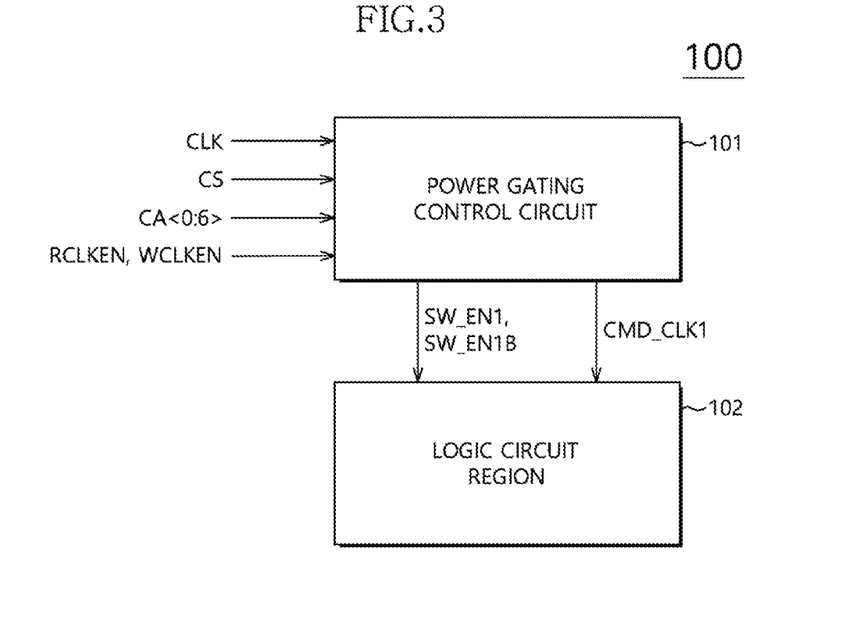
FIG. 3 is a block diagram illustrating a configuration of a power gating system, according to an embodiment of the present disclosure.

FIG. 3 is a block diagram illustrating a configuration of a power gating system 100, according to an embodiment.

The power gating system 100 may be configured, for example, in the memory 20 of FIG. 2.

Referring to FIG. 3, the power gating system 100 may include a power gating control circuit 101 and a logic circuit region 102.

The logic circuit region 102 may include a plurality of logic gates.

The plurality of logic gates may include logic gates related to the I/O of a clock signal.

The power supply to the plurality of logic gates may be shut off according to power gating signals SW_EN1 and SW_EN1B.

The power gating control circuit 101 may generate the first gating clock signal CMD_CLK1 controlled to start transition after stabilization of an internal power voltage according to the chip select signal CS, the command/address signal CA<0:N>, and the clock signal CLK. The clock signal CLK is also referred to herein as the external clock signal.

The power gating control circuit 101 may generate the power gating signals SW_EN1 and SW_EN1B according to the chip select signal CS and the command/address signal CA<0:N>.

The power gating control circuit 101 may control an activation period of the first gating clock signal CMD_CLK1 to match a read operation and a write operation.

The power gating control circuit 101 may control the activation period of the first gating clock signal CMD_CLK1 to match the read operation and the write operation according to a read command delay signal RCLKEN and a write command delay signal WCLKEN.

Figure 4:
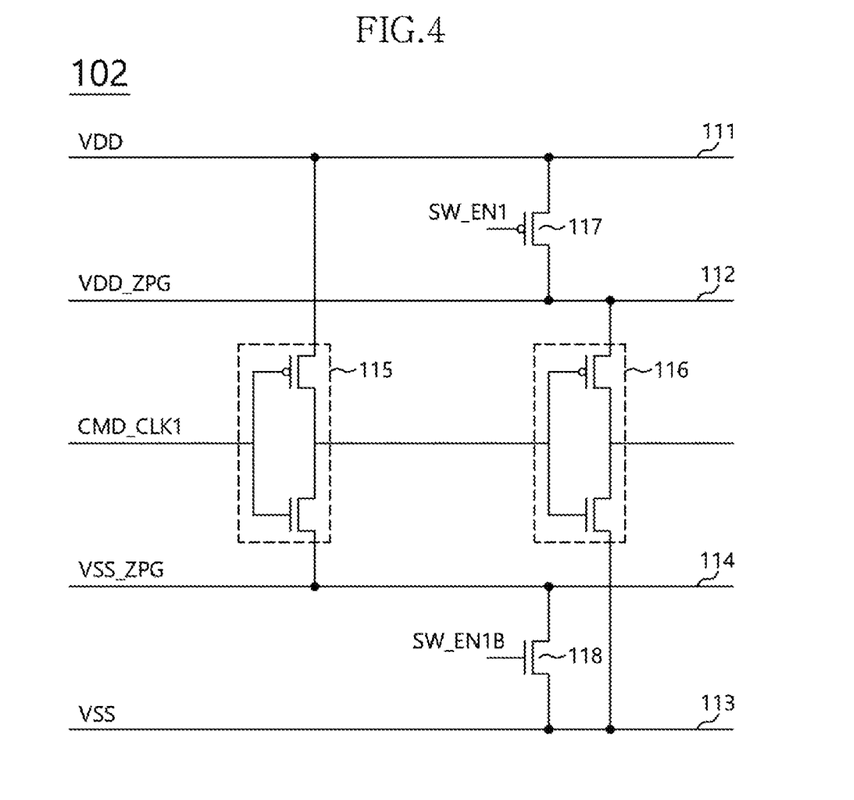
FIG. 4 is a schematic diagram illustrating a configuration of a logic circuit region of FIG. 3.

FIG. 4 is a schematic diagram illustrating a configuration of the logic circuit region 102 of FIG. 3.

Referring to FIG. 4, the logic circuit region 102 may include first to fourth power lines 111, 112, 113, and 114, a plurality of logic gates 115 and 116, and power gating switches 117 and 118.

In addition to the logic gates 115 and 116 illustrated in FIG. 4, a plurality of logic gates may be further included in the logic circuit region 102. For clarity of description, only a limited number of possible logic gates are illustrated in FIG. 4.

An external power voltage, for example, the first power voltage VDD, may be applied to the logic gate 115 through the first power line 111.

The second power line 112 may be coupled to the first power line 111 through the power gating switch 117 and may apply an internal power voltage, for example, a power voltage applied through the first power line 111, to the logic gate 116 as the second power voltage VDD_ZPG.

An external ground voltage, for example, the first ground voltage VSS, may be applied to the logic gate 116 through the third power line 113.

The fourth power line 114 may be coupled to the third power line 113 through the power gating switch 118 and may apply an internal power voltage, for example, a power voltage applied through the third power line 113, to the logic gate 115 as the second ground voltage VSS_ZPG.

Although not shown in FIG. 4, a constant power voltage, for example, the first power voltage VDD and/or the first ground voltage VSS may be applied to partial logic gates among the logic gates included in the logic circuit region 102.

In the power-down mode, the power gating signals SW_EN1 and SW_EN1B may be at the low level and the high level, respectively, and thus the power supply to the logic gates 115 and 116 may be shut off.

The power gating control circuit 100, to be described in detail later, may control input signals (for example, first gating clock signal CMD_CLK1) of the logic gates 115 and 116 to start transition after a time sufficient to stabilize the second power voltage VDD_ZPG and the second ground voltage VSS_ZPG to target levels when the power gating signals SW_EN1 and SW_EN1B transition to the high level and the low level, respectively, according to the power-down mode exit.

Accordingly, the malfunctions of the logic gates 115 and 116 due to a floating current may be prevented.

Figure 5:
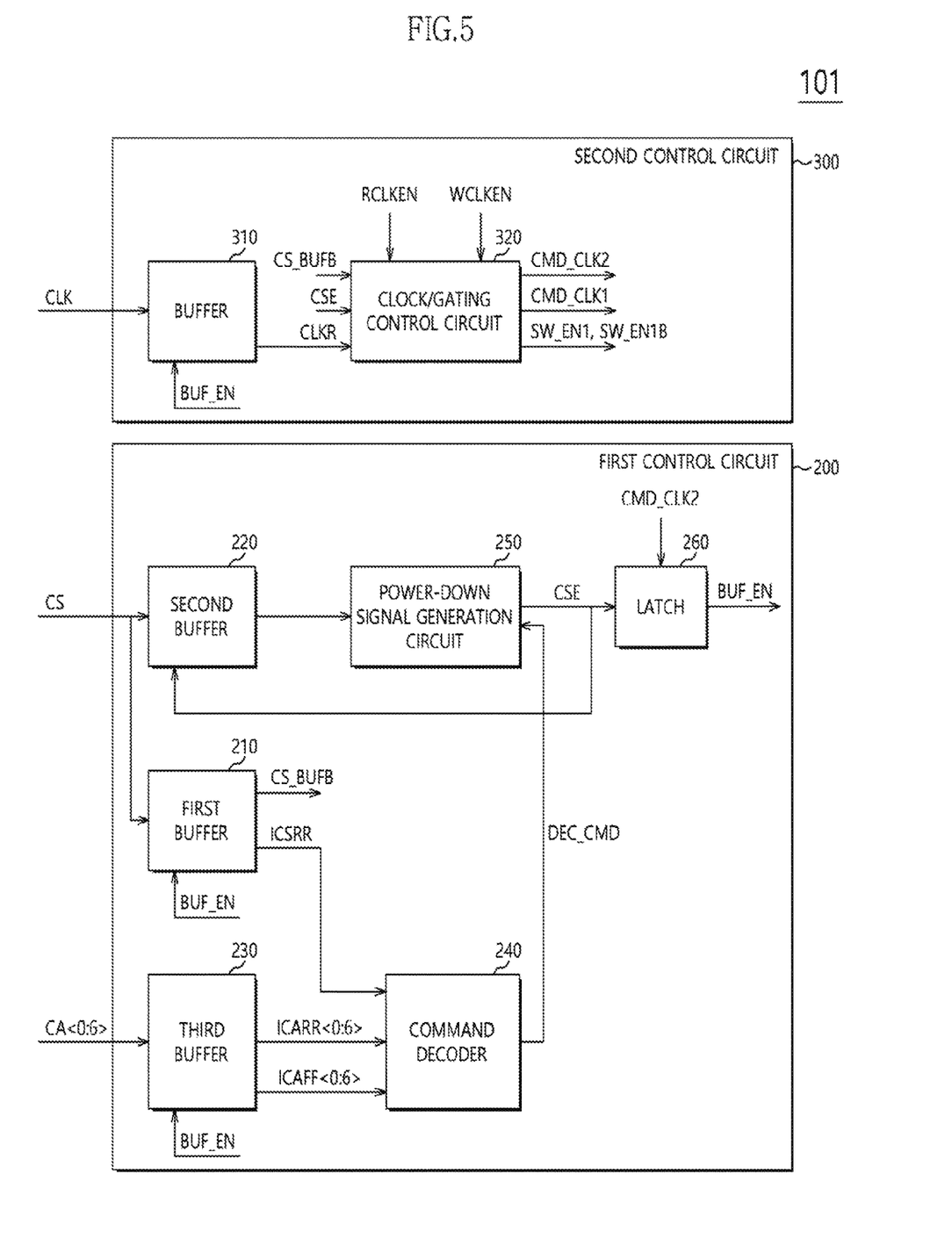
FIG. 5 is a block diagram illustrating a configuration of a power gating control circuit of FIG. 3.

FIG. 5 is a diagram illustrating a configuration of the power gating control circuit 101 of FIG. 3.

Referring to FIG. 5, the power gating control circuit 101 may include a first control circuit 200 and a second control circuit 300.

The first control circuit 200 may generate a power-down signal CSE and a buffer enable signal BUF_EN according to the chip select signal CS and the command/address signal CA<0:N>.

The first control circuit 200 may include first to third buffers 210, 220, and 230, a command decoder 240, a power-down signal generation circuit 250, and a latch 260.

The first to third buffers 210 to 230, the command decoder 240, the power-down signal generation circuit 250, and the latch 260 may be operated according to a second gating clock signal CMD_CLK2.

The first buffer 210 may be activated according to the buffer enable signal BUF_EN and receive the chip select signal CS.

The first buffer 210 may output the received chip select signal CS as internal signals CS_BUFB and ICSRR.

The internal signal CS_BUFB may have an opposite phase to the chip select signal CS.

The second buffer 220 may be activated according to the power-down signal CSE and receive the chip select signal CS.

The third buffer 230 may be activated according to the buffer enable signal BUF_EN and receive the command/address signal CA<0:N>.

The third buffer 230 may output the received command/address signal CA<0:N> as internal signals ICARR<0:6> and ICAFF<0:6>.

The internal signal ICARR<0:6> may be a signal in which the command/address signal CA<0:N> is received on the basis of a rising edge of the second gating clock signal CMD_CLK2 and the internal signal ICAFF<0:6> may be a signal in which the command/address signal CA<0:N> is received on the basis of a falling edge of the second gating clock signal CMD_CLK2.

The command decoder 240 may generate a decoding signal DEC_CMD by decoding an output signal ICSRR of the first buffer 210 and output signals ICARR<0:6> and ICAFF<0:6> of the third buffer 230.

The power-down signal generation circuit 250 may generate a power-down signal CSE according to an output signal of the second buffer 220 and the decoding signal DEC_CMD.

The power-down signal generation circuit 250 may activate the power-down signal CSE when the decoding signal DEC_CMD has a value indicating the power-down mode entry PDE and the chip select signal CS have transitioned to the high level.

When the chip select signal CS is transitioned to the high level again in a power-down mode entry PDE state, the power-down signal generation circuit 250 may determine the current state to a power-down mode exit PDX and inactivate the power-down signal CSE.

The latch 260 may latch and invert the power-down signal CSE according to the second gating clock signal CMD_CLK2 and output the inverted signal as the buffer enable signal BUF_EN.

The second control circuit 300 may generate the power gating signals SW_EN1 and SW_EN1B, the first gating clock signal CMD_CLK1, and the second gating clock signal CMD_CLK2 according to the clock signal CLK, the internal signal CS_BUFB of the first control circuit 200, the power-down signal CSE, the read command delay signal RCLKEN, and the write command delay signal WCLKEN.

The second control signal 300 may include a buffer 310 and a clock/gating control circuit 320.

The buffer 310 may be activated according to the buffer enable signal BUF_EN and receive the clock signal CLK.

The buffer 310 may output the received clock signal CLK as an internal clock signal CLKR.

The clock/gating control circuit 320 may generate the power gating signals SW_EN1 and SW_EN1B, the first gating clock signal CMD_CLK1, and the second gating clock signal CMD_CLK2 according to the internal clock signal CLKR, the internal signal CS_BUFB of the first control circuit 200, the power-down signal CSE, the read command delay signal RCLKEN, and the write command delay signal WCLKEN.

Figure 6:
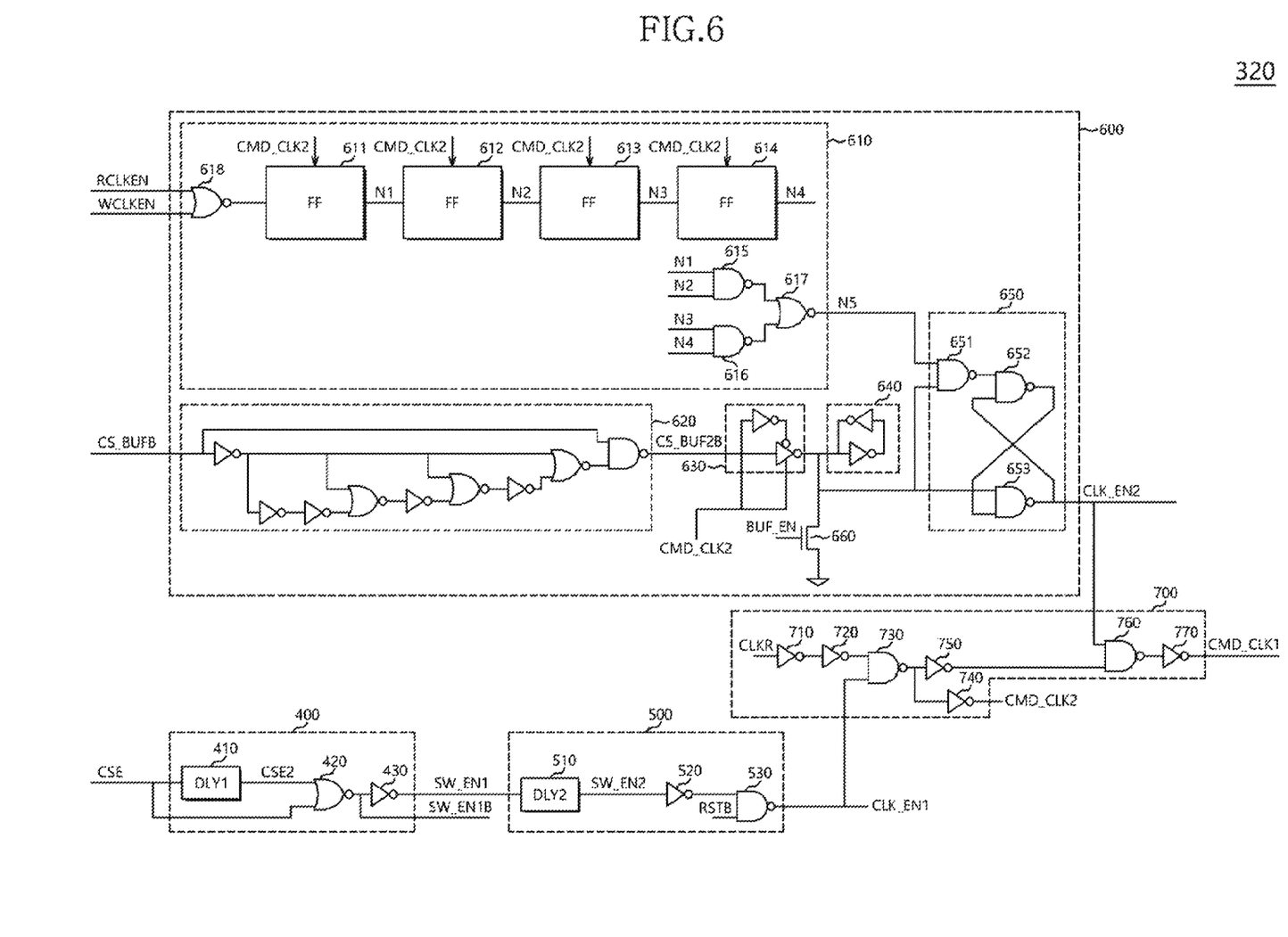
FIG. 6 is a schematic diagram illustrating a configuration of a clock/gating control circuit of FIG. 4.

FIG. 6 is a schematic diagram illustrating a configuration of the clock/gating control circuit 320 of FIG. 5.

Referring to FIG. 6, the clock/gating control circuit 320 may include a power gating signal generation circuit 400, a first clock gating control circuit 500, a second clock gating control circuit 600, and a gating clock signal generation circuit 700.

The power gating signal generation circuit 400 may include a first delay (DLY1) 410 and logic gates 420 and 430.

The first delay (DLY1) 410 may delay the power-down signal CSE by a preset time and output a delayed power-down signal CSE2.

The logic gate 420 may generate the power gating signal SW_EN1B by performing an NOR operation on the power-down signal CSE and an output signal CSE2 of the first delay (DLY1) 410.

The stabilization time for stable power down may be ensured by delaying the power-down signal CSE by the preset time through the first delay (DLY1) 410.

The logic gate 430 may generate the power gating signal SW_EN1 by inverting the power gating signal SW_EN1B.

When entering the power-down mode according to an external command, the power-down signal CSE may be activated to the low level.

When the power-down signal CSE is transitioned to the low level and then the delay time of the first delay (DLY1) 410 elapses, the power gating signals SW_EN1 and SW_EN1B may be the low level and the high level, respectively.

When exiting the power-down mode according to the transition of the chip select signal CS in the power-down mode, the power-down signal CSE may be inactivated to the high level.

When the power-down signal CSE is transitioned to the high level, the power gating signals SW_EN1 and SW_EN1B may be the high level and the low level, respectively.

The first clock gating control circuit 500 may include a second delay (DLY2) 510 and logic gates 520 and 530.

The second delay (DLY2) 510 may delay the power gating signal SW_EN1 by a preset time and output a delayed signal SW_EN2.

The logic gate 520 may invert an output signal SW_EN2 of the second delay (DLY2) 510 and output an inverted signal.

The logic gate 530 may perform a NAND operation on an output signal of the logic gate 520 and a reset signal RSTB and output an NAND-operated result as the first clock gating control signal CLK_EN1.

The power-down signal CSE may be transitioned to the high level according to the power-down mode exit and the power gating signals SW_EN1 and SW_EN1B may be at the high level and low level, respectively.

When the power gating signal SW_EN1 is transitioned to the high level and then the delay time of the second delay (DLY2) 510 elapses, the first clock gating control signal CLK_EN1 may be activated to the high level.

For an embodiment, the first gating clock signal CMD_CLK1 may be activated only when the first clock gating control signal CLK_EN1 is activated.

In an embodiment, even when the power gating signal SW_EN1 is transitioned to the high level according to the power-down mode exit, the activation of the first clock gating control signal CLK_EN1 may be delayed through the second delay (DLY2) 510, and thus the time margin for voltage stabilization of the second power voltage VDD_ZPG and the second ground voltage VSS_ZPG may be ensured.

The second clock gating control circuit 600 may include a timing signal generation circuit 610, a delay circuit 620, a switching circuit 630, a first latch 640, and a second latch 650.

The timing signal generation circuit 610 may generate a timing signal N5 according to the read command delay signal RCLKEN, the write command delay signal WCLKEN, and the second gating clock signal CMD_CLK2.

The timing signal generation circuit 610 may include a plurality of flip flops 611, 612, 613, and 614 and a plurality of logic gates 615 to 618.

The logic gate 618 may perform a NOR operation on the read command delay signal RCLKEN and the write command delay signal WCLKEN and output a NOR-operated result.

The plurality of flip flops 611 to 614 may output a plurality of preliminary timing signals N1 to N4 by sequentially shifting an output signal of the logic gate 618 according to the second gating clock signal CMD_CLK2.

The logic gate 615 may perform a NAND operation on the preliminary timing signals N1 and N2 among the plurality of preliminary timing signals N1 to N4 and output a NAND-operated result.

The logic gate 616 may perform a NAND operation on the preliminary timing signals N3 and N4 among the plurality of preliminary timing signals N1 to N4 and output a NAND-operated result.

The logic gate 617 may perform a NOR operation on an output signal of the logic gate 615 and an output signal of the logic gate 616 and output a NOR-operated result as the timing signal N5.

The read command delay signal RCLKEN may be a signal generated to maintain an activation level (for example, high level) by a first time interval sufficient to complete an actual read operation after a read command input.

The write command delay signal WCLKEN may be a signal generated to maintain an activation level (for example, high level) by a second time interval sufficient to complete an actual write operation after a write command input.

The first time interval and the second time interval may be changed according to a kind of memory, an operation standard, and the like.

Because the timing signal N5 is a signal that the NOR-operated result of the read command delay signal RCLKEN and the write command delay signal WCLKEN is shifted, the timing signal N5 may be activated after the actual read operation and the actual write operation are completed.

After the read operation or the write operation is completely performed, the first gating clock signal CMD_CLK1 might not need to be applied to the logic circuit region 102 (see FIG. 3).

Accordingly, the timing signal N5 may be used as a criterion for determining whether or not to shut off the supply of the first gating clock signal CMD_CLK1.

The delay circuit 620 may delay the internal signal CS_BUFB, for example, the rising edge of the chip select signal CS, received from the first buffer 210, and output a delayed result.

The switching circuit 630 may pass the output signal CS_BUF2B of the delay circuit 620 according to the second gating clock signal CMD_CLK2.

The first latch 640 may latch an output signal of the switching circuit 630.

The second latch 650 may have an SR latch structure including a plurality of logic gates 651 to 653 and may activate the second clock gating control signal CLK_EN2 according to the output signal of the switching circuit 630 and inactivate the second clock gating control signal CLK_EN2 according to the timing signal N5.

The transistor 660 may activate the second clock gating control signal CLK_EN2 according to the buffer enable signal BUF_EN.

The gating clock signal generation circuit 700 may include a plurality of logic gates 710, 720, 730, 740, 750, 760, and, 770.

When the first clock gating control signal CLK_EN1 is activated to the high level, the internal clock signal CLKR may be output as the second gating clock signal CMD_CLK2 via the logic gates 710 to 740.

When the first clock gating control signal CLK_EN1 and the second clock gating control signal CLK_EN2 are activated to the high level, the internal clock signal CLKR may be output as the first gating clock signal CMD_CLK1 via the logic gates 710 to 730 and 750 to 770.

Figure 7:
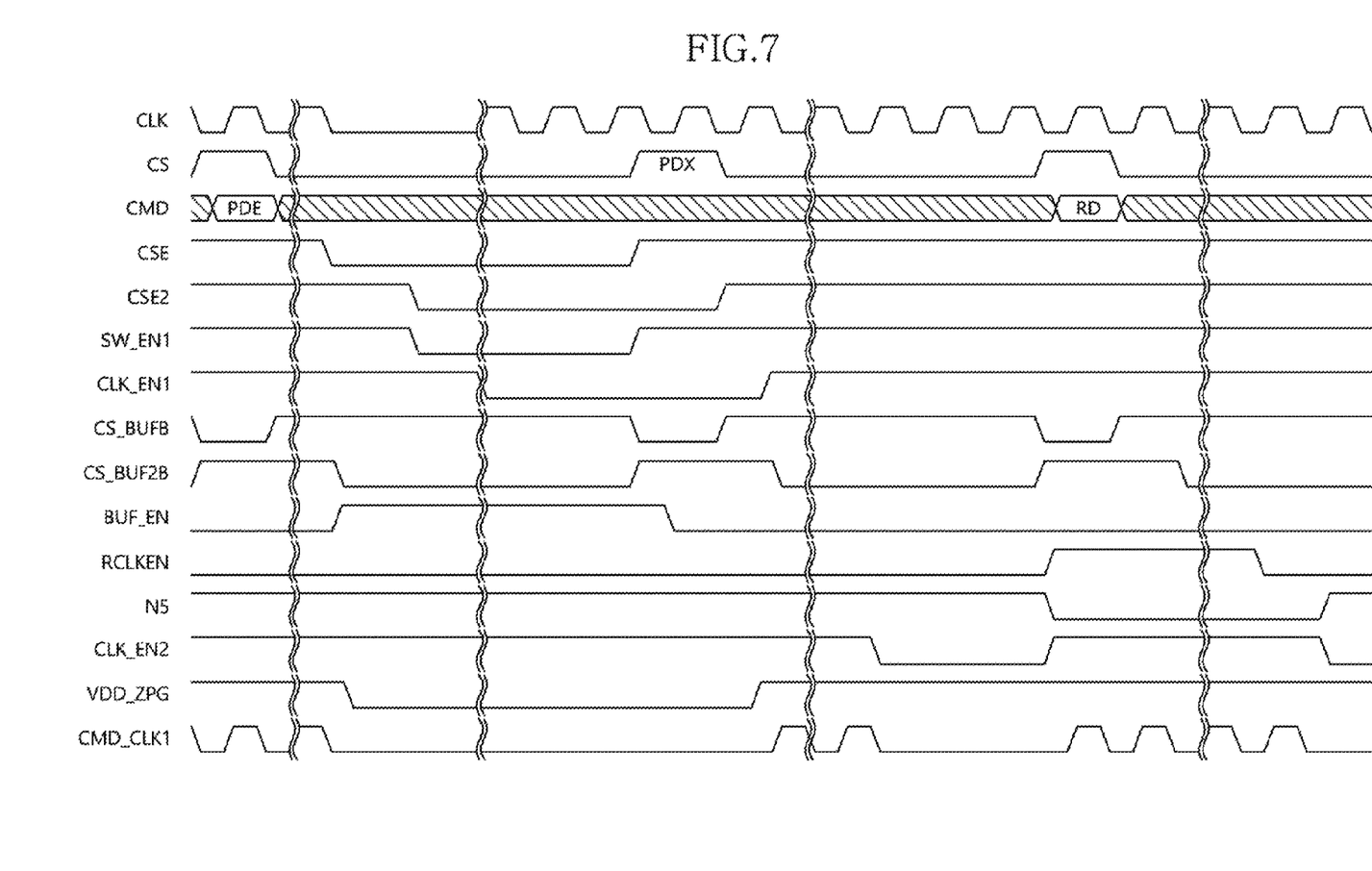
FIG. 7 is a timing diagram illustrating a power gating control operation, according to an embodiment of the present disclosure.

FIG. 7 is a timing diagram illustrating a power gating control operation, according to an embodiment.

The power gating control operation is described with reference to FIGS. 2 to 7.

The power-down mode entry PDE of the memory 20 may be accomplished through a combination of the chip select signal CS and the command/address signal CA<0:N> provided from an external device, for example, the processor 30.

The internal signal CS_BUFB may be transitioned to the low level based on the chip select signal CS, and the second clock gating control circuit 600 may activate the second clock gating control signal CLK_EN2 to the high level.

The second clock gating control signal CLK_EN2 may be maintained to the activation level during the power-down mode period.

As the power-down mode entry PDE is accomplished, the power-down signal generation circuit 250 may generate the power-down signal CSE of the low level.

The buffer enable signal BUF_EN may be transitioned to the high level based on the power-down signal CSE of the low level.

As the buffer enable signal BUF_EN is transitioned to the high level, all the remaining buffers other than the buffer 220, which receives the chip select signal CS, among the buffers 210 to 230 and 310 of the power gating control circuit 101 may be inactivated.

As the power-down signal CSE is activated to the low level, the power gating signal generation circuit 400 may generate the power gating signals SW_EN1 and SW_EN1B of the low level and the high level, respectively, after the delay time of the first delay 410.

As the power gating signals SW_EN1 and SW_EN1B are the low level and the high level, respectively, the power supply to the logic gates of the logic circuit region 102 may be shut off.

When the power gating signals SW_EN1 and SW_EN1B are the low level and the high level, respectively, the first clock gating control circuit 500 may inactivate the first clock gating control signal CLK_EN1 to the low level after the delay time of the second delay 510.

Because the first clock gating control signal CLK_EN1 has the low level, the first gating clock signal CMD_CLK1 may be fixed to the low level.

As the processor 30 toggles the chip select signal CS in the power-down mode entry PDE state, the power-down mode exit PDX of the memory 20 may be accomplished.

As the power-down mode exit PDX is accomplished, the power-down signal generation circuit 250 may allow the power-down signal CSE to be transitioned to the high level.

The buffer enable signal BUF_EN may be activated to the low level based on the inactivated power-down signal CSE.

The buffer 220, which receives the chip select signal CS, may be inactivated based on the inactivated power-down signal CSE.

As the buffer enable signal BUF_EN is activated to the low level, all the buffers 210, 230, and 310 of the power gating control circuit 101 may be activated.

As the power-down signal CSE is activated to the high level, the power gating signal generation circuit 400 may generate the power gating signals SW_EN1 and SW_EN1B of the high level and the low level, respectively.

As the power gating signals SW_EN1 and SW_EN1B are the high level and the low level, respectively, the first clock gating control circuit 500 may activate the first clock gating control signal CLK_EN1 to the high level after the delay time of the second delay 510.

During the delay time of the second delay (DLY2) 510 after the power gating signals SW_EN1 and SW_EN1B are the high level and the low level, respectively, the second power voltage VDD_ZPG may be booted up to a target level by the first power voltage VDD, and the second ground voltage VSS_ZPG may be drop to a target level by the first ground voltage VSS.

The second clock gating control signal CLK_EN2 may be maintained to the activation level based on the internal signal CS_BUF2B and the buffer enable signal BUF_EN. Accordingly, as the first clock gating control signal CLK_EN1 is activated to the high level, the internal clock signal CLKR may be provided to the logic gates of the logic circuit region 102 as the first gating clock signal CMD_CLK1.

Because the second power voltage VDD_ZPG and the second ground voltage VSS_ZPG have been already stabilized to the target levels at the timing that the first clock gating control signal CLK_EN1 is activated to the high level, the floating current is not generated even when the first gating clock signal CMD_CLK1 is toggled.

After the power-down mode exit PDX, a read command RD with the chip select signal CS may be input in a normal operation mode.

The second clock gating control signal 600 may activate the second clock gating control signal CLK_EN2 to the high level according to the internal signal CS_BUF2B transitioned based on the chip select signal CS.

Because the first clock gating control signal CLK_EN1 is maintained to the activation level, the internal clock signal CLKR may be provided to the logic gates of the logic circuit region 102 as the first gating clock signal CMD_CLK1 during the performing of the read operation.

The read command delay signal RCLKEN generated according to the read command RD may be maintained to the high level for a determined time interval and the timing signal N5 may be activated to the low level according to the read command delay signal RCLKEN of the high level.

The second clock gating control signal CLK_EN2 may be inactivated by the timing signal N5.

As the second clock gating control signal CLK_EN2 is inactivated, the toggling of the first gating clock signal CMD_CLK1 may be blocked and the first gating clock signal CMD_CLK1 may be maintained to the low level.

In an embodiment, while the read operation and the write operation according to active commands, for example, the read command RD and the write command WT, are performed, the first gating clock signal CMD_CLK1 may be provided to the logic circuit region 102. The read operation and the write operation are terminated, the toggling of the first gating clock signal CMD_CLK1 may be blocked, and thus the power consumption may be reduced.

The embodiments described above for the present teachings are intended to illustrate and not to limit the present teachings. Various alternatives and equivalents are possible. The present teachings should not be limited by the embodiments described herein. Nor are the present teachings limited to any specific type of semiconductor apparatus. Other additions, subtractions, or modifications are possible in view of the present disclosure and are intended to fall within the scope of the appended claims.

What is claimed is:

1. A power gating system comprising:
   a logic circuit region including at least one logic gate configured to receive a first gating clock signal;
   a power gating switch configured to shut off an internal power voltage applied to the at least one logic gate according to a power gating signal; and
   a power gating control circuit configured to generate the first gating clock signal which is controlled to start transition after stabilization of an internal power voltage according to a chip select signal, a command/address signal, and an external clock signal,
   wherein the power gating control circuit is further configured to generate the power gating signal according to the chip select signal and the command/address signal.

2. The power gating system of claim 1, wherein the power gating control circuit comprises:
   a first control circuit configured to generate a power-down signal according to the chip select signal and the command/address signal; and
   a second control circuit configured to generate the first gating clock signal according to the external clock signal, the chip select signal, and the power-down signal.

3. The power gating system of claim 2, wherein the first control circuit comprises:
a command decoder configured to generate a decoding signal by decoding the chip select signal and the command/address signal; and
a power-down signal generation circuit configured to generate the power-down signal according to the chip select signal and the decoding signal.

4. The power gating system of claim 3, wherein the first control circuit further comprises:
a latch configured to latch the power-down signal and output a latched signal as a buffer enable signal;
a first buffer configured to be activated according to the buffer enable signal and to receive the chip select signal; and
a second buffer configured to be activated according to the power-down signal and to receive the chip select signal.

5. The power gating system of claim 2, wherein the second control circuit comprises:
a power gating signal generation circuit configured to generate the power gating signal according to the power-down signal;
a first clock gating control circuit configured to generate a first clock gating control signal by delaying the power gating signal by a predetermined time; and
a gating clock signal generation circuit configured to generate the first gating clock signal using an internal clock signal according to the first clock gating control signal.

6. A power gating system comprising:
a logic circuit region including at least one logic gate configured to receive a first gating clock signal;
a power gating switch configured to shut off an internal power voltage applied to the at least one logic gate according to a power gating signal; and
a power gating control circuit configured to generate the first gating clock signal which is controlled to start transition after stabilization of an internal power voltage according to a chip select signal, a command/address signal, and an external clock signal, and control an activation period of the first gating clock signal to match a read operation and a write operation,
wherein the power gating control circuit is further configured to generate the power gating signal according to the chip select signal and the command/address signal.

7. The power gating system of claim 6, wherein the power gating control circuit comprises:
a first control circuit configured to generate a power-down signal according to the chip select signal and the command/address signal; and
a second control circuit configured to generate the first gating clock signal according to the external clock signal, the chip select signal, and the power-down signal.

8. The power gating system of claim 7, wherein the first control circuit comprises:
a command decoder configured to generate a decoding signal by decoding the chip select signal and the command/address signal; and
a power-down signal generation circuit configured to generate the power-down signal according to the chip select signal and the decoding signal.

9. The power gating system of claim 8, wherein the first control circuit further comprises:
a latch configured to latch the power-down signal and output a latched signal as a buffer enable signal;
a first buffer configured to be activated according to the buffer enable signal and to receive the chip select signal; and
a second buffer configured to be activated according to the power-down signal and to receive the chip select signal.

10. The power gating system of claim 7, wherein the second control circuit comprises:
a power gating signal generation circuit configured to generate the power gating signal according to the power-down signal;
a first clock gating control circuit configured to generate a first clock gating control signal by delaying the power gating signal by a predetermined time;
a second clock gating control circuit configured to generate a second clock gating control signal according to a read command delay signal, a write command delay signal, and the chip select signal; and
a gating clock signal generation circuit configured to generate the first gating clock signal using an internal clock signal according to the first clock gating control signal and the second clock gating control signal.

11. The power gating system of claim 10, wherein the read command delay signal is generated to maintain an activation level by a first time interval sufficient to complete an actual read operation after input of a read command, and
the write command delay signal is generated to maintain the activation level by a second time interval sufficient to complete an actual write operation after input of a write command.

12. The power gating system of claim 10, wherein the second clock gating control circuit includes:
a timing signal generation circuit configured to generate a timing signal according to the read command delay signal and the write command delay signal;
a delay circuit configured to delay and output the chip select signal; and
a latch configured to activate the second clock gating control signal according to an output signal of the delay circuit and to inactivate the second clock gating control signal according to the timing signal.

* * * * *